(12) United States Patent
Kato et al.

(10) Patent No.: US 12,356,563 B2
(45) Date of Patent: Jul. 8, 2025

(54) ELECTRONIC CONTROL COMPONENT BRACKET

(71) Applicant: DAIWA KASEI INDUSTRY CO., LTD., Okazaki (JP)

(72) Inventors: Makoto Kato, Okazaki (JP); Katsuya Hirakawa, Okazaki (JP); Yasuto Kojo, Toyota (JP)

(73) Assignee: DAIWA KASEI INDUSTRY CO., LTD., Okazaki (JP)

( * ) Notice: Subject to any disclaimer, the term of this patent is extended or adjusted under 35 U.S.C. 154(b) by 23 days.

(21) Appl. No.: 18/410,030

(22) Filed: Jan. 11, 2024

(65) Prior Publication Data
US 2024/0244770 A1 Jul. 18, 2024

(30) Foreign Application Priority Data
Jan. 17, 2023 (JP) .................. 2023-004823

(51) Int. Cl.
G06F 1/16 (2006.01)
B60R 16/023 (2006.01)
H05K 5/02 (2006.01)

(52) U.S. Cl.
CPC ....... *H05K 5/0204* (2013.01); *B60R 16/0239* (2013.01)

(58) Field of Classification Search
CPC ...... H05K 5/0204; H05K 5/0073; H05K 7/18; H05K 5/0217; B60R 16/0239
See application file for complete search history.

(56) References Cited

U.S. PATENT DOCUMENTS

| 7,575,203 | B2* | 8/2009 | Lan ................ G11B 33/12 248/220.21 |
| 7,938,376 | B2* | 5/2011 | Jimenez ............ B60R 11/00 248/229.16 |
| 8,210,378 | B2 | 7/2012 | Takeuchi et al. |
| 10,026,453 | B1* | 7/2018 | Chang ............... G06F 1/187 |
| 11,654,843 | B2 | 5/2023 | Ukai et al. |

FOREIGN PATENT DOCUMENTS

| JP | 2010-130705 A | 6/2010 |
| JP | 2020-102480 A | 7/2020 |

* cited by examiner

*Primary Examiner* — Amy J. Sterling
(74) *Attorney, Agent, or Firm* — McClure, Qualey & Rodack, LLP

(57) ABSTRACT

Provided is an electronic control component bracket that does not allow an electronic control component such as an ECU to be easily detached even if an unexpected external force is applied to the electronic control component, in a case where the bracket is assembled with the electronic control component. When a case of the electronic control component is assembled with an electronic control component bracket, an upper end of an elastic extending portion is moved into a bottom wall portion side of a disengagement-preventing portion so as to be stored in a gap.

3 Claims, 6 Drawing Sheets

ELECTRONIC CONTROL COMPONENT BRACKET

RELATED APPLICATIONS

This application claims the priority of Japanese Patent Application No. 2023-004823 filed on Jan. 17, 2023. The disclosure of the prior application is hereby incorporated herein in the entirety by reference.

BACKGROUND OF THE INVENTION

Field of the Invention

This invention relates to an electronic control component bracket for assembling an electronic control component such as an ECU in a vehicle body.

Description of Related Art

For example, an ECU (electronic control unit) of a vehicle has a circuit substrate (electronic control portion) inside a casing (ECU case), and is attached to a panel member of a vehicle body by using a bracket. Japanese Laid-Open Patent Publication No. 2020-102480 describes a technique for allowing such a bracket to reduce vibration applied to the ECU due to traveling vibration of a vehicle. Meanwhile, in a case where the electronic control component such as an ECU is assembled, such a bracket is also required to firmly assemble the electronic control component so as not to easily detach the electronic control component.

SUMMARY OF THE INVENTION

An object of this invention is to provide an electronic control component bracket that does not allow an electronic control component such as an ECU to be easily detached even if an unexpected external force is applied to the electronic control component, in a case where the bracket is assembled with the electronic control component.

An electronic control component bracket for achieving the aforementioned object is an electronic control component bracket that is assembled with a resin case which has an electronic control portion thereinside, and which has a rectangular upper surface, a rectangular lower surface, and four side surfaces surrounding an outer peripheral side between the upper surface and the lower surface and including an assembling side surface formed so as to have an elastic extending portion protruding outward and then extending in an outer peripheral direction from a protrusion end, having a free end at an end, and having a width in an up-down direction, in which the electronic control component bracket is formed as a resin injection-molded product in which a bottom wall portion disposed so as to oppose the lower surface of the case, and a side wall portion disposed so as to stand from the bottom wall portion and oppose the corresponding assembling side surface are integrated with each other, the side wall portion has an elastic wall portion which is disposed between two cut portions each having an opening at an end side (upper side) in a standing direction and extending toward the bottom wall portion (downward) and which has a lower stiffness than the elastic extending portion, and a disengagement-preventing portion protruding inward (toward a side on which the case is disposed) from the end side (upper side) of the elastic wall portion in the standing direction, the disengagement-preventing portion has a downward protrusion that protrudes from a protrusion end side of the disengagement-preventing portion toward the bottom wall portion (downward), and that forms a gap between the elastic wall portion and the downward protrusion, and when the case is moved close to the bottom wall portion with the lower surface of the case being disposed at a head such that the assembling side surface opposes the corresponding side wall portion in order to assemble the case, the elastic extending portion is moved over the disengagement-preventing portion, to cause elastic deformation of the elastic wall portion, the elastic deformation is released after the elastic extending portion has been moved over the disengagement-preventing portion, an upper end of the elastic extending portion is moved into the bottom wall portion side (lower side) of the disengagement-preventing portion so as to be stored in the gap according to the elastic deformation being released, and the case is assembled in a disengagement preventing state.

According to this invention, when the electronic component case which has an electronic control portion thereinside is assembled with the electronic control component bracket (hereinafter, also referred to as bracket), elastic deformation is caused such that the upper side of the elastic wall portion having a low stiffness is pressed outward to allow entrance of the case. When the case has been assembled, the upper end of the elastic extending portion is moved into the lower side of the disengagement-preventing portion, and disengagement of the case is thus prevented. In the assembled state, if an upward external force is applied to the case, the upper end of the elastic extending portion presses upward the disengagement-preventing portion at a position on the inner side of the elastic wall portion, so that an outward pressing force acts on the upper side of the elastic wall portion, and elastic deformation similar to the elastic deformation during the assembling may be caused. However, in the bracket according to this invention, in this assembled state, the upper end of the elastic extending portion is disposed between the downward protrusion and an inner wall surface of the elastic wall portion at which the downward protrusion is formed (stored in the gap). Therefore, generation of the outward elastic deformation at the upper side of the elastic wall portion is prevented by the elastic extending portion. Moreover, the elastic extending portion has a higher stiffness than the elastic wall portion. Therefore, the deformation inhibiting effect is sufficiently exhibited.

Furthermore, for the bracket of this invention, the elastic extending portion has a base end portion protruding outward from the assembling side surface, an intermediate extending portion which extends in the outer peripheral direction by changing the extending direction at the end of the base end portion, and an end portion having a free end at its end. In this case, when the upper end of the elastic extending portion is disposed (stored in the gap) between the downward protrusion and the inner wall surface of the elastic wall portion, the downward protrusion and (the upper end of) the base end portion are disposed so as to oppose each other in the outer peripheral direction. Therefore, movement of the case relative to the bracket in the outer peripheral direction can be inhibited by contact between the downward protrusion and (the upper end of) the base end portion.

The case may have a left side surface and a right side surface as the assembling side surface, and the side wall portion may be wall portions that stand from both sides, in a predetermined width direction, of the bottom wall portion, one of the side wall portions may be a left side wall portion disposed so as to oppose the left side surface, and another side wall portion may be a right side wall portion disposed so as to oppose the right side surface. In this configuration, the left side wall portion and the right side wall portion each have the disengagement-preventing portion having the downward protrusion, and the elastic extending portion can be stored in each gap. Therefore, both the left side wall portion and the right side wall portion can inhibit elastic deformation that causes outward widening in the left-right direction in a state where the case is assembled, and disengagement of the case can thus be prevented.

The bottom wall portion has a plurality of pressing-up elastic pieces that press upward the lower surface of the case in the assembled state, to maintain a lock-engaged state in which the upper end of the elastic extending portion is pressed against a lower surface of the disengagement-preventing portion, and, in the assembled state, when the lower surface of the case is maintained so as to be pressed upward by the pressing-up elastic pieces, the lower surface of the case is positioned above a bottom surface of the bottom wall portion so as to be spaced upward from the bottom surface over a distance greater than a downward protruding length of the downward protrusion. In this configuration, when the lower surface of the case assembled with the bracket is moved close to the bottom surface of the bottom wall portion of the bracket, the upper end of the elastic extending portion can be disengaged downward from the gap between the downward protrusion and the inner wall surface of the elastic wall portion. In this state, the elastic wall portion is allowed to be elastically deformed outward, and the case can be removed by the outward elastic deformation.

DETAILED DESCRIPTION

An embodiment of this invention will be described below with reference to the drawings.

Figure 1:
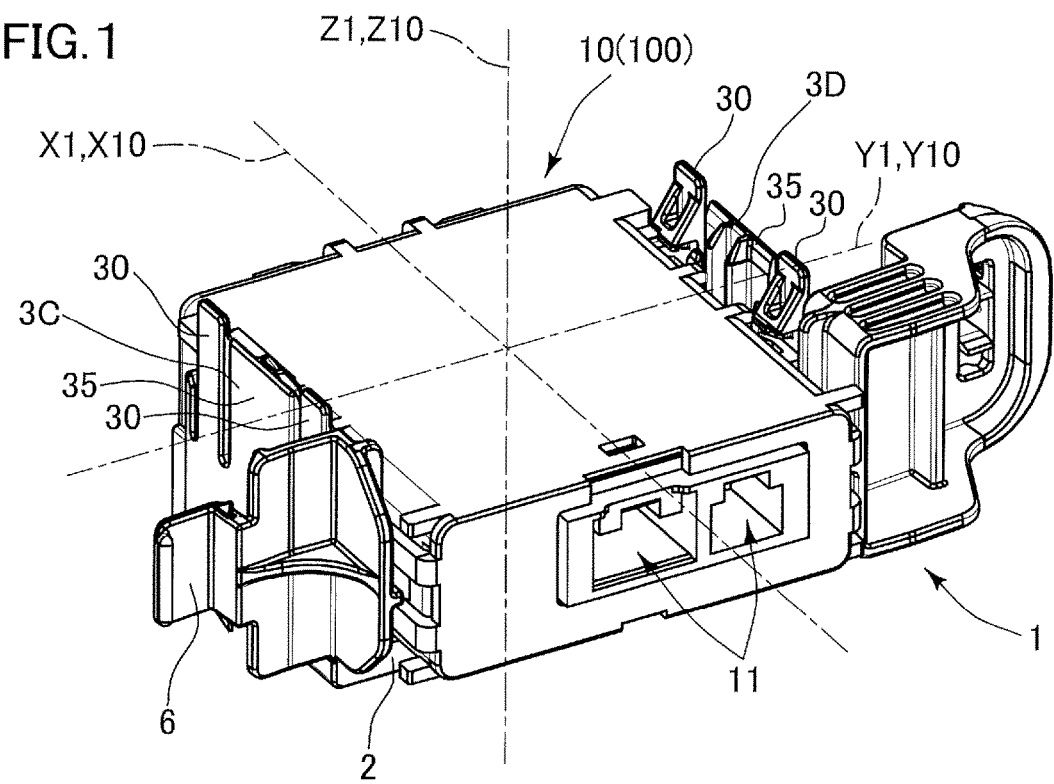
FIG. 1 is a perspective view showing a state where a case of an electronic control component is assembled with an electronic control component bracket of this invention.

An electronic control component bracket 1 of this embodiment is a component for attaching an electronic control component 100 (ECU) to a vehicle body, and is assembled with a resin case 10 of the electronic control component 100 (ECU) as shown in FIG. 1.

The up-down direction Z10, the left-right direction Y10, and the front-rear direction X10 used herein are defined as directions that are orthogonal to each other with respect to the electronic control component 100 and the case 10. These directions are axial directions that are set for describing a three-dimensional shape of the case 10 for convenience sake, and may not necessarily coincide with the actual up-down direction (gravitational direction), left-right direction, and front-rear direction during use or the like.

Figure 3:
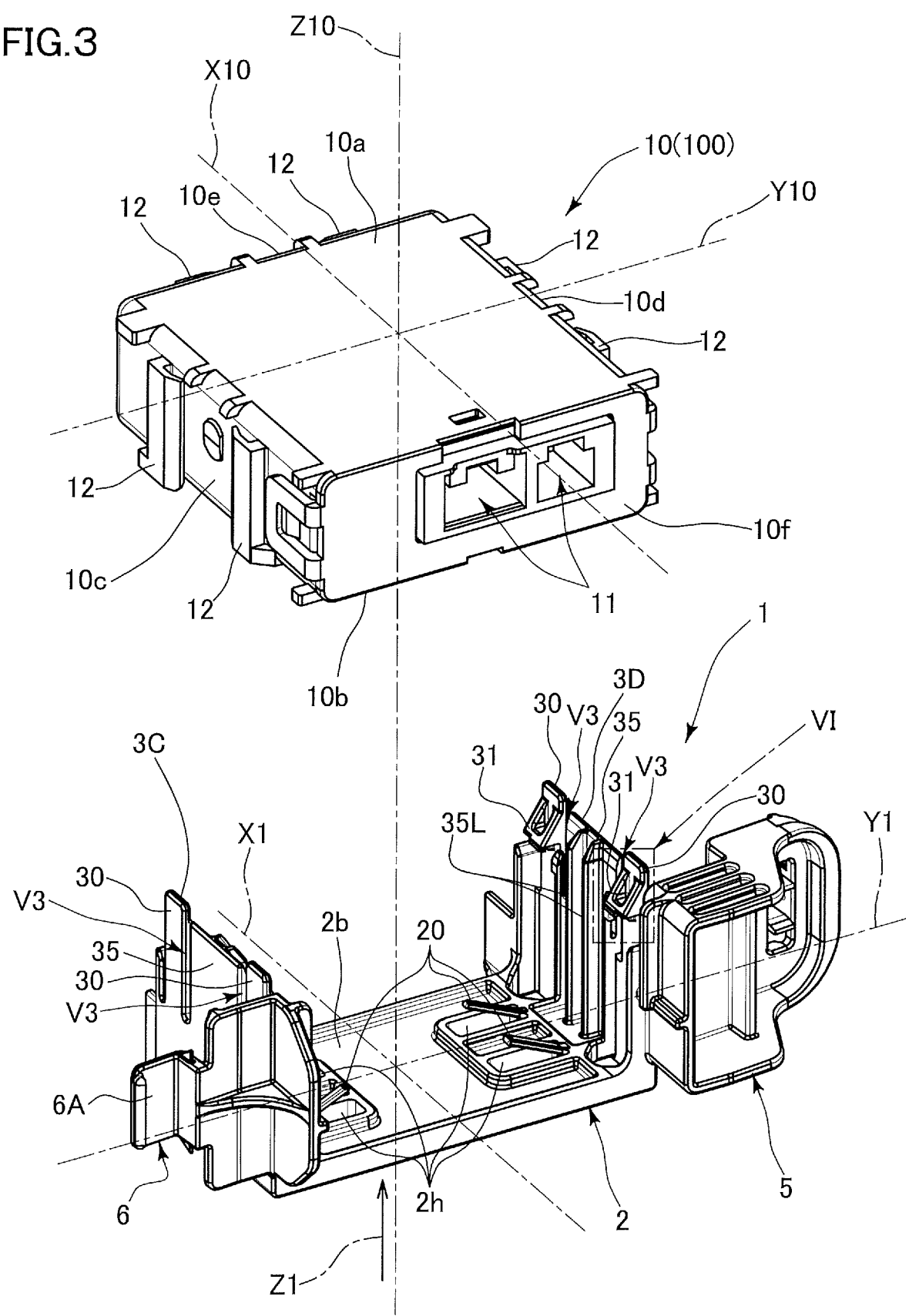
FIG. 3 is an exploded perspective view showing the state in FIG. 1.
Figure 4:
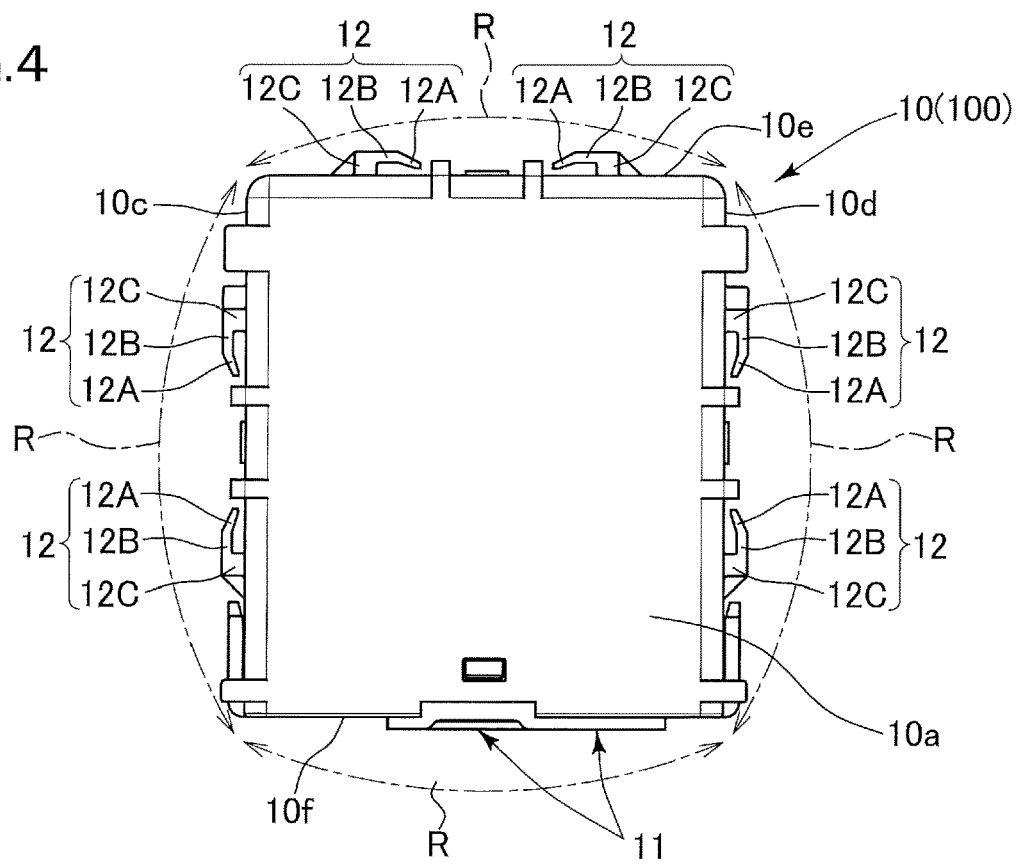
FIG. 4 is a plan view of the case in FIG. 1.

The electronic control component 100 is structured such that the case 10 has an electronic control portion (not shown) thereinside. The case 10 has rectangular (square in this embodiment) upper surface 10a and lower surface 10b, and outer peripheral side surfaces 10c, 10d, 10e, 10f surrounding an outer peripheral side between the upper and the lower surfaces 10a and 10b, as shown in FIG. 3 and FIG. 4. In this embodiment, the outer peripheral side surfaces 10c, 10d, 10e, 10f are four side surfaces 10c, 10d, 10e, 10f that correspond to four sides of the upper surface 10a and the lower surface 10b and stand in the up-down direction Z10, and the case 10 is rectangular-parallelepiped-shaped. The side surfaces 10c, 10d, 10e, 10f include assembling side surfaces 10c, 10d, 10e in each of which an elastic extending portion 12 that protrudes outward and then extends in the outer peripheral direction R from the protrusion end, and has a free end at its end is formed so as to have a width in the up-down direction Z10.

In this invention, at least one of the assembling side surfaces 10c, 10d, 10e needs to serve as the assembling side surface.

In this embodiment, the assembling side surfaces 10c, 10d, 10e are three side surfaces corresponding to the left side surface 10c, the right side surface 10d, and the rear side surface (back surface) 10e, among the four side surfaces 10c, 10d, 10e, 10f. The remaining front side surface 10f (front surface) has an opening having a predetermined shape, and a connection portion 11 (connector) of an electronic control component (ECU) inside the case is exposed through the opening.

The elastic extending portion 12 has a base end portion 12C (fixed end) protruding outward from a corresponding one of the assembling side surfaces 10c, 10d, 10e, an intermediate extending portion 12B extending from the protrusion end of the base end portion 12C (fixed end) in parallel with the assembling side surface 10c, 10d, 10e, and an end portion 12A (free end) extending from the extension end of the intermediate extending portion 12B in the extending direction thereof, as shown in FIG. 4. In this embodiment, the end portion 12A forms an inclined piece that is inclined so as to be close to the corresponding one of the assembling side surfaces 10c, 10d, 10e, and is tapered so as to reduce the thickness (so as to be thinner) toward the end in the extending direction.

Each of the assembling side surfaces 10c, 10d, 10e and the end portion 12A of the elastic extending portion 12 formed in the corresponding assembling side surface are disposed close to each other (in a non-contact state) in a natural state of the elastic extending portion 12. Each elastic extending portion 12 can be elastically deformed so as to swing the end side (end portion 12A side) about the base end portion 12C side serving as a fulcrum in the direction in which the end side is moved close to and away from the corresponding one of the assembling side surfaces 10c, 10d, 10e.

In this embodiment, the elastic extending portions 12 are paired so as to be aligned in the outer peripheral direction R in each of the assembling side surfaces 10c, 10d, 10e, and the paired elastic extending portions 12 have the end portions 12A (free ends) disposed at the respective end sides in such extending directions that the paired elastic extending portions 12 approach each other (or extend away from each other).

Figure 2:
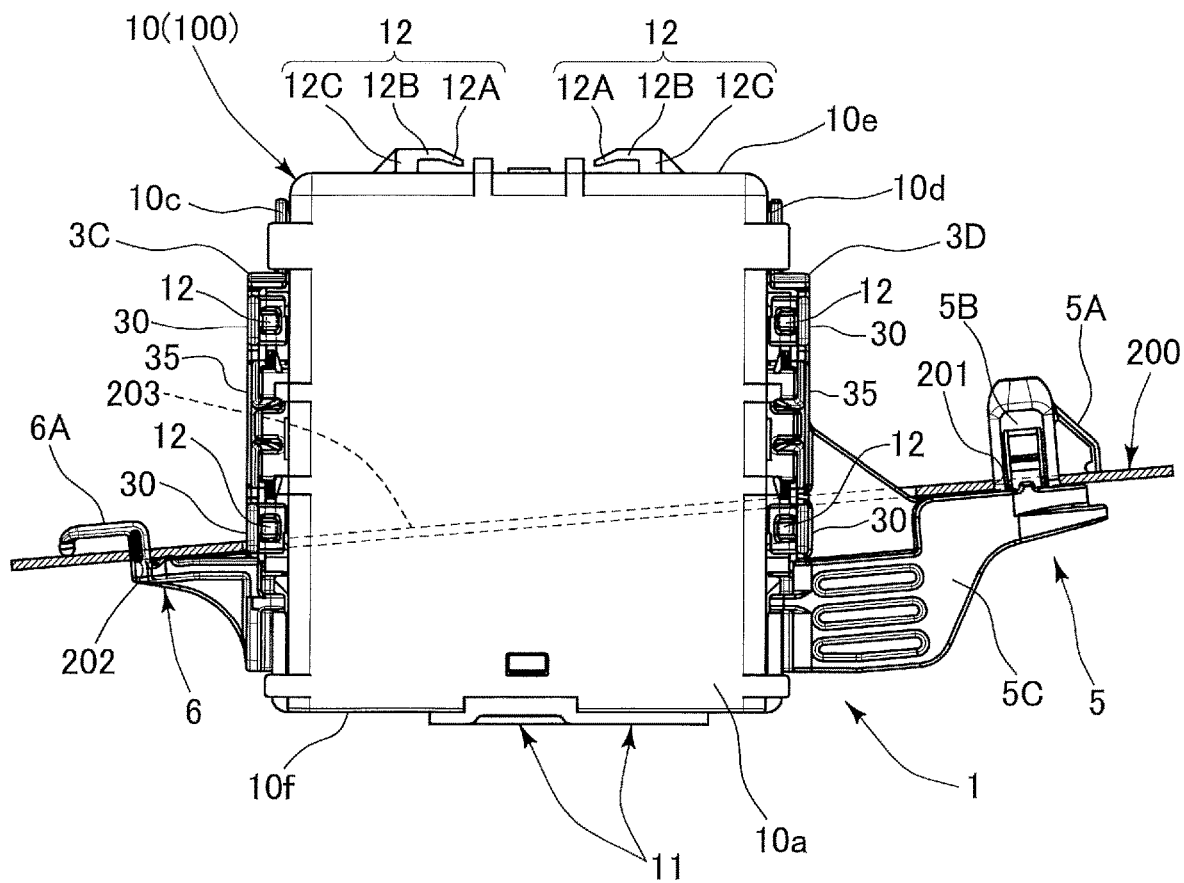
FIG. 2 is a cross-sectional view showing a state where the electronic control component bracket in FIG. 1 is assembled with a vehicle body in a planar view.

The electronic control component bracket 1 is formed as a resin injection-molded product in which a bottom wall portion 2 (see FIG. 3) disposed so as to oppose the lower surface 10b of the case 10, and side wall portions 3C, 3D each disposed so as to stand from the bottom wall portion 2 and oppose a corresponding one of the assembling side surfaces 10c, 10d are integrated with each other, as shown in FIG. 1 to FIG. 3. In this embodiment, the side wall portions 3C, 3D are wall portions (standing direction Z1) that stand from both sides, in a predetermined width direction Y1 (bracket left-right width direction), of the bottom wall portion 2 (bottom surface 2b), one of the side wall portions is a left side wall portion 3C disposed so as to oppose the left side surface 10c of the case 10, and the other of the side wall portions is a right side wall portion 3D disposed so as to oppose the right side surface 10d of the case 10.

The electronic control component bracket 1 has engaging portions 5, 6 (see FIG. 2) as a vehicle-body assembling portion for assembling the electronic control component 100 in a vehicle body.

In this embodiment, among the engaging portions 5, 6, the first engaging portion 5 is an insertion engaging portion which is engaged and fixed so as to be inserted in a first fixing hole 201 of a panel member 200 of a vehicle body, and lock-engaged with a peripheral portion of the fixing hole 201 by an inserted portion (from the depth side), as shown in FIG. 2. In this embodiment, the first engaging portion 5 has an engagement support portion 5C formed so as to protrude outward from the right side wall portion 3D, a column portion 5B formed so as to protrude in the direction orthogonal to the outward direction at the end side of the engagement support portion 5C, and an elastic lock-engaging piece 5A extending from the end side of the column portion 5B in the outward direction of the column portion 5B toward the base end side. The column portion 5B and the elastic lock-engaging piece 5A are inserted in the first fixing hole 201, and the elastic lock-engaging piece 5A is elastically deformed toward the column portion 5B at that time, and is elastically restored after passing through the first fixing hole 201, whereby the first engaging portion 5 is lock-engaged with the peripheral portion of the first fixing hole 201 and enters a disengagement preventing state, so that the first engaging portion 5 is engaged and fixed (insertion-fixed).

In this embodiment, among the engaging portions 5, 6, the second engaging portion 6 extends outward from the left side wall portion 3C and has a hook-like portion 6A at the extension end, as shown in FIG. 2. The second engaging portion 6 is an elastic arm that allows the end side portion (hook-like portion 6A side) to be elastically deformed in the direction orthogonal to the outward direction. In this embodiment, the second engaging portion 6 is a go-around lock-engaging portion that is lock-engaged (brought into contact) with the peripheral portion of a second fixing hole 202 by moving the hook-like portion 6A around to the rear side of the panel member 200 when the second engaging portion 6 is inserted in the second fixing hole 202 of the panel member 200 of the vehicle body in the same direction as the direction in which the first engaging portion 5 is inserted in the first fixing hole 201.

For attaching the first and the second engaging portions 5, 6 to the panel member 200, the second engaging portion 6 is firstly inserted in the second fixing hole 202 of the panel member 200. Thereafter, the first engaging portion 5 is inserted in the first fixing hole 201 of the panel member 200. As a result, while the end of the hook-like portion 6A of the second engaging portion 6 presses the panel member 200 from the depth side toward the front side in the insertion direction, the first engaging portion 5 is engaged with and fixed into (insertion-fixed) the first fixing hole 201. This state is a state in which the electronic control component bracket 1 has been attached to the panel member 200. In this embodiment, in a state where the electronic control component bracket 1 is attached to the panel member 200, the electronic control component 100 (case 10 formed of a resin) assembled with the electronic control component bracket 1 is disposed in a state of being inserted in an opening (reference character 203) such as a through hole, a recess, or a cut portion of the panel member 200.

The engaging portions 5, 6 are not limited to ones of this embodiment, and may be assembled with a vehicle body in a different shape or by a different engaging method. At this time, an object with which the engaging portions 5, 6 are assembled may not necessarily be the panel member.

Figure 5:
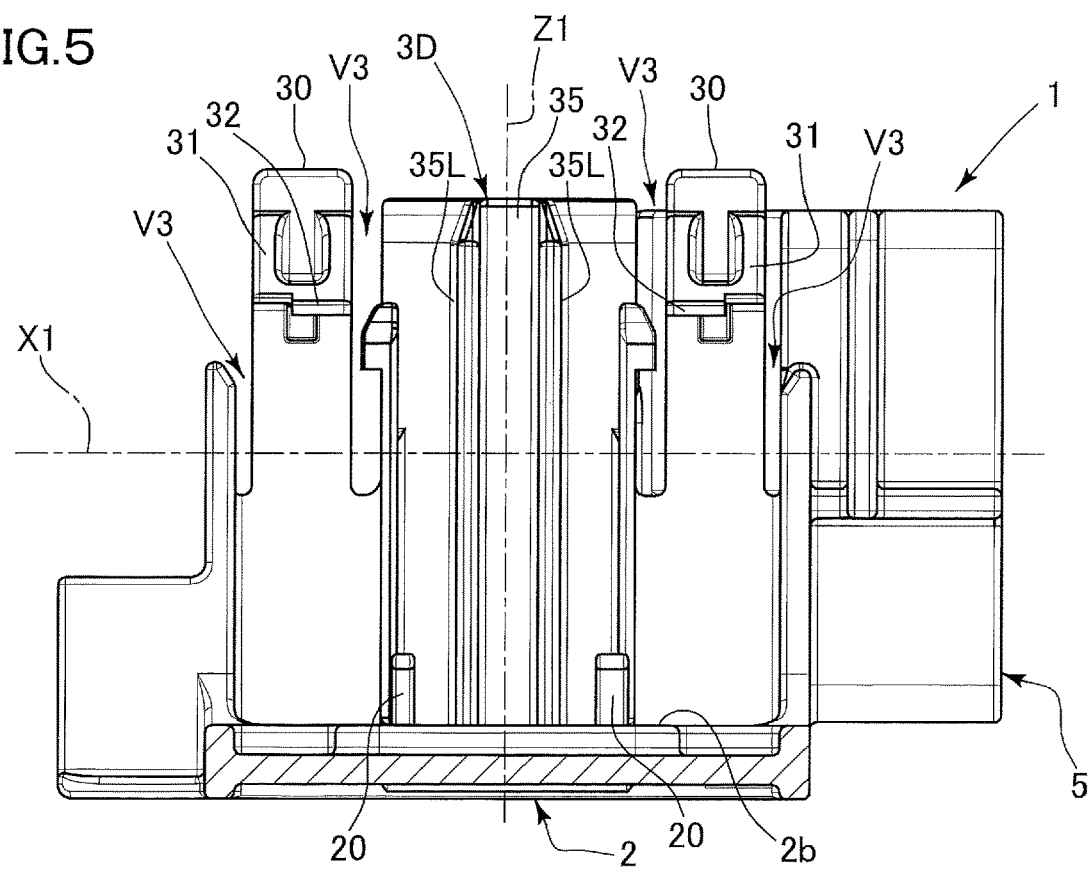
FIG. 5 is an enlarged view of a side wall portion of the electronic control component bracket in FIG. 1 as viewed from the inside thereof.

As shown in FIG. 5, the side wall portions 3C, 3D each have an elastic wall portion 30 and a disengagement-preventing portion 31. The elastic wall portion 30 is disposed between two cut portions V3 each having an opening at the end side (upper side) in the standing direction Z1 and extending toward the bottom wall portion 2 (downward), and has a lower stiffness than the elastic extending portion 12. The disengagement-preventing portion 31 protrudes inward (toward a side on which the case 10 is disposed) from the end side (upper side), in the direction Z10, of the elastic wall portion 30. In this embodiment, the elastic wall portion 30 is deformed more easily than the elastic extending portion 12 mainly because of the thickness of the elastic wall portion 30 and the presence of the cut portions V3. The elastic wall portion 30 may be deformed more easily than the elastic extending portion 12 because of, for example, difference between a resin material of the case 10 and a resin material of the electronic control component bracket 1. The disengagement-preventing portion 31 has a downward protrusion 32 (protrusion) that protrudes from the protrusion end side of the disengagement-preventing portion 31 toward the bottom wall portion 2 (downward), and forms a gap S3 (see FIG. 9) between the elastic wall portion 30 and the downward protrusion 32. In this embodiment, two elastic wall portions 30 are formed so as to be aligned in the width direction X1 (bracket front-rear width direction) of the side wall portion 3C, 3D. A center wall portion 35 which has reinforcing ribs 35L, 35L extending in the standing direction Z1 is formed between the two elastic wall portions 30 and 30 aligned with each other.

FIG. 5 shows the side wall portion 3D. However, the elastic wall portions 30, the disengagement-preventing portions 31, and the center wall portion 35 are similarly formed also in the side wall portion 3C.

Figure 8:
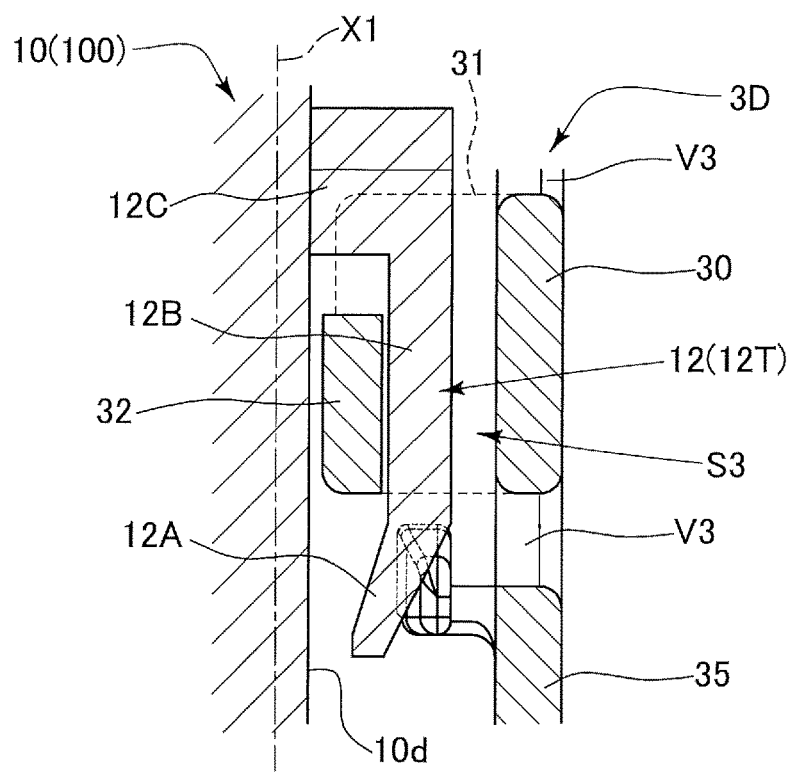
FIG. 8 is a partially enlarged cross-sectional view obtained by cutting the case and the bracket in the assembled state shown in FIG. 1 at a position of a downward protrusion.
Figure 9:
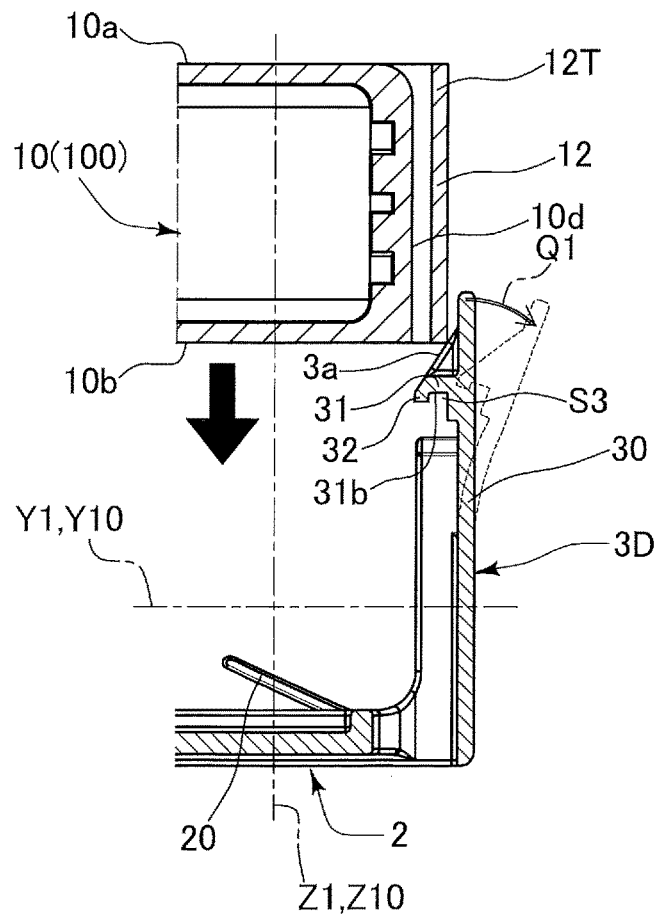
FIG. 9 shows a method for assembling the case of the electronic control component with the electronic control component bracket in FIG. 1 with reference to an enlarged view of an IX portion in FIG. 7.

Assembling the case 10 with the electronic control component bracket 1 will be described. FIG. 8 and FIG. 9 show assembling at the side wall portion 3D side. However, the assembling at the side wall portion 3C on the opposite side is performed in the same manner as at the side wall portion 3D side.

For assembling the case 10 with the electronic control component bracket 1, the case 10 is firstly moved close to the bottom wall portion 2 with the lower surface 10b being disposed at the head such that the assembling side surfaces 10c, 10d of the case 10 oppose the side wall portions 3C, 3D, as shown in FIG. 3 and FIG. 9. At this time, the elastic extending portion 12 is moved over the disengagement-preventing portion 31, to elastically deform (distort) the end side of the elastic wall portion 30 outward. This elastic deformation is released after the elastic extending portion 12 has been moved over the disengagement-preventing portion 31 (the elastic extending portion 12 need not be restored to a natural state), and an upper end 12T of the elastic extending portion 12 is moved into the bottom wall portion 2 side (lower side) of the disengagement-preventing portion 31 so as to be stored in the gap S3 according to the elastic deformation being released (see FIG. 7). Thus, the case 10 (electronic control component) is assembled with the electronic control component bracket 1 in a disengagement preventing state.

Figure 7:
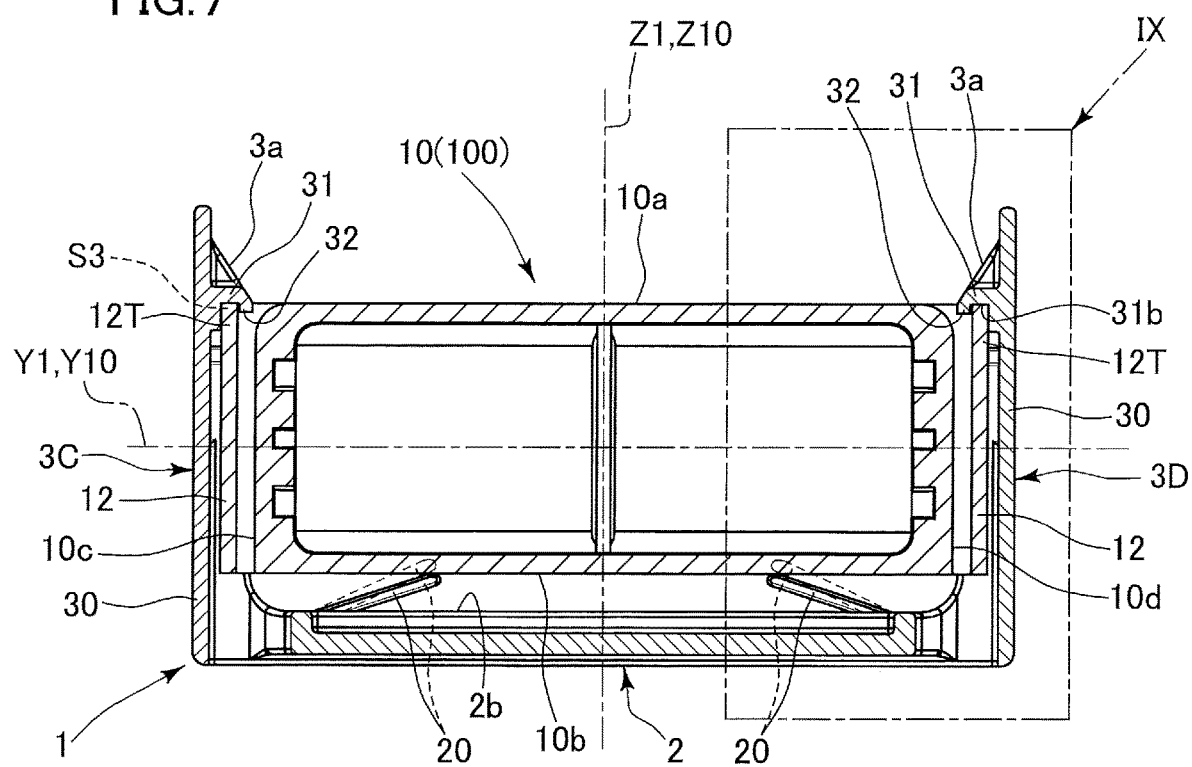
FIG. 7 is a cross-sectional view obtained by cutting the case and the bracket in the assembled state shown in FIG. 1 at a position of a disengagement-preventing portion in the up-down direction.

In this embodiment, the bottom wall portion 2 has a plurality of pressing-up elastic pieces 20, as shown in FIG. 3 and FIG. 7. The pressing-up elastic pieces 20 press upward the lower surface 10b of the case 10 in the assembled state, to maintain a lock-engaged state in which the upper end of the elastic extending portion 12 is pressed against a rear surface 31b (lower surface of the disengagement-preventing portion 31) of the disengagement-preventing portion 31 (see FIG. 7). In this embodiment, four pressing-up elastic pieces 20 are symmetrically disposed on the bottom surface 2b of the bottom wall portion 2.

Figure 6:
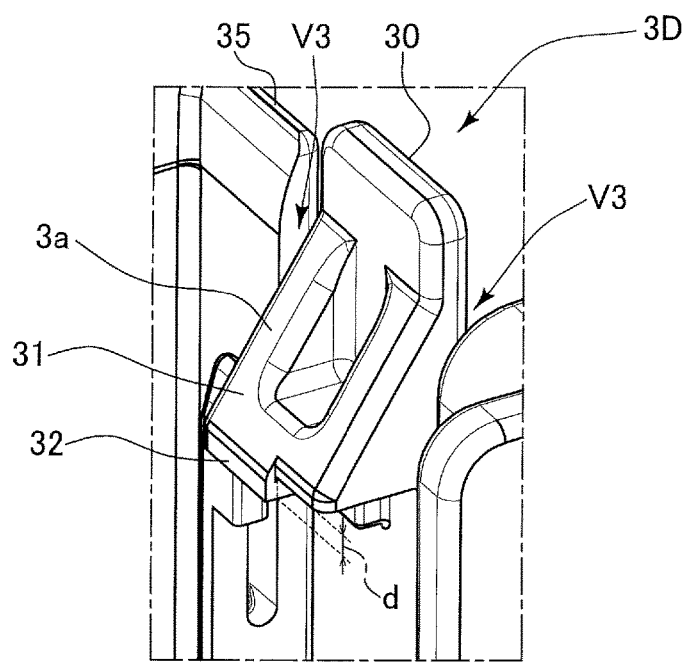
FIG. 6 is an enlarged view of a VI portion in FIG. 3.

In the assembled state, as shown in FIG. 7, when the lower surface 10b of the case 10 is maintained so as to be pressed upward by the pressing-up elastic pieces 20, the lower surface 10b of the case 10 is positioned above the bottom surface 2b of the bottom wall portion 2 so as to be spaced upward from the bottom surface 2b over a distance greater than a downward protruding length d (see FIG. 6) of the downward protrusion 32. That is, the lower surface 10b of the case 10 is disposed at a higher position than a position that is spaced upward from the bottom surface 2b of the bottom wall portion 2 over the height d. As a result, when the lower surface 10b of the case 10 is brought into contact with or moved close to the bottom surface 2b of the bottom wall portion 2 against the pressing-up force of the pressing-up elastic pieces 20, the upper end 12T of the elastic extending portion 12 can be easily disengaged from the gap S3.

Furthermore, as shown in FIG. 3, the bottom wall portion 2 has a plurality of through holes 2h that penetrate in the standing direction Z1 of the side wall portions 3C, 3D, and each pressing-up elastic piece 20 extends diagonally upward above a corresponding one of the through holes 2h in a cantilevered manner in a state where the peripheral portion of the through hole 2h serves as a base end side, and can be elastically deformed in the up-down direction with the end side being a free end. In the assembled state (see FIG. 7), each pressing-up elastic piece 20 is deformed downward, and the case 10 (electronic control component) is maintained so as to be constantly pressed upward. When each pressing-up elastic piece 20 is deformed downward, the pressing-up elastic piece 20 is inserted in the through hole 2h without interfering with the bottom surface 2b of the bottom wall portion 2. The dashed line of the pressing-up elastic piece 20 in FIG. 7 represents the pressing-up elastic piece 20 in a natural state (non-elastically-deformed state).

In this embodiment, the side wall portions 3C, 3D are the left side wall portion 3C and the right side wall portion 3D which are formed so as to stand from both the left and the right sides of the bottom wall portion 2, and oppose each other. In each of the left and the right side wall portions 3C, 3D, the elastic wall portion 30 and the disengagement-preventing portion 31 are formed, and the disengagement-preventing portion 31 has a guide inclined surface 3a (see FIG. 6) formed so as to extend in the downward direction toward the bottom wall portion 2 side (downward) and the inner side (side on which the case 10 is disposed) at the end in the standing direction Z1.

When the case 10 (electronic control component) is assembled with the electronic control component bracket 1, each elastic extending portion 12 of the case 10 is brought into contact with the guide inclined surface 3a of the disengagement-preventing portion 31 which is formed at a corresponding one of the elastic wall portions 30, as shown in FIG. 9. By pressing the guide inclined surface 3a toward the bottom wall portion 2 (downward), elastic deformation is caused such that the upper end side of each of the elastic wall portions 30 of the side wall portions 3C, 3D is pressed and widened outward (direction indicated by an arrow Q1 in FIG. 9), and a distance between the side wall portions 3C and 3D opposing each other is increased by the press-widening, and the case 10 is moved into the depth side (lower side).

When the case 10 has been moved into the depth side (lower side), and each elastic extending portion 12 has been moved over the disengagement-preventing portion 31 (has passed through the guide inclined surface 3a), each of the elastic wall portions 30 of the side wall portions 3C, 3D is elastically restored. Each elastic extending portion 12 of the case 10 is moved into the lower side of the disengagement-preventing portion 31 formed in a corresponding one of the elastic wall portions 30 according to the elastic restoration, as shown in FIG. 7. At this time, the case 10 is in a state of being pressed upward by the pressing-up elastic pieces 20, and the upper end 12T of each elastic extending portion 12 is pressed against the rear surface 31b of a corresponding one of the disengagement-preventing portions 31 by the upward pressing of the case 10, and is maintained in a state of being stored in a corresponding one of the gaps S3 (see FIG. 9).

In the stored state, the downward protrusion 32 is surrounded by the assembling side surface 10c, 10d, and the elastic extending portion 12 (the base end portion 12C, the intermediate extending portion 12B, and the end portion 12A), as shown in FIG. 8. The intermediate extending portion 12B of the elastic extending portion 12 is mainly stored in the gap S3, and the end portion 12A is positioned outside the gap S3.

Meanwhile, in this embodiment, the downward protrusion 32 is formed on one side at the rear surface 31b (see FIG. 7) of the disengagement-preventing portion 31 so as to deviate in the width direction X1 (front-rear direction) of the elastic wall portion 30, and is not formed on the other side, as shown in FIG. 8. In this stored state, a side on which the downward protrusion 32 is not formed at the rear surface 31b of the disengagement-preventing portion 31 is a portion (position at which the base end portion 12C is disposed) through which the base end portion 12C of the elastic extending portion 12 passes, and the side on which the downward protrusion 32 is not formed at the rear surface 31b of the disengagement-preventing portion 31 and the base end portion 12C are in contact with each other.

Figure 10:
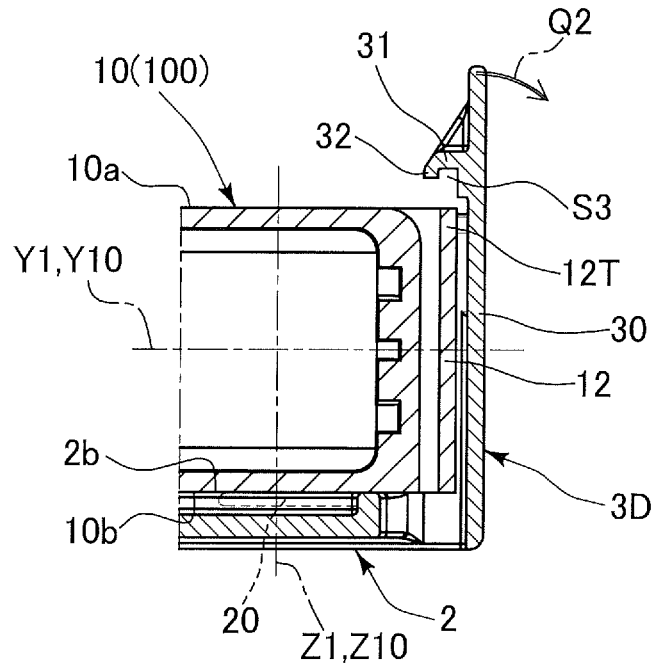
FIG. 10 shows a method for disassembling the case of the electronic control component from the electronic control component bracket, in FIG. 1, assembled with the case, with reference to an enlarged view of the IX portion in FIG. 7.
Figure 11:
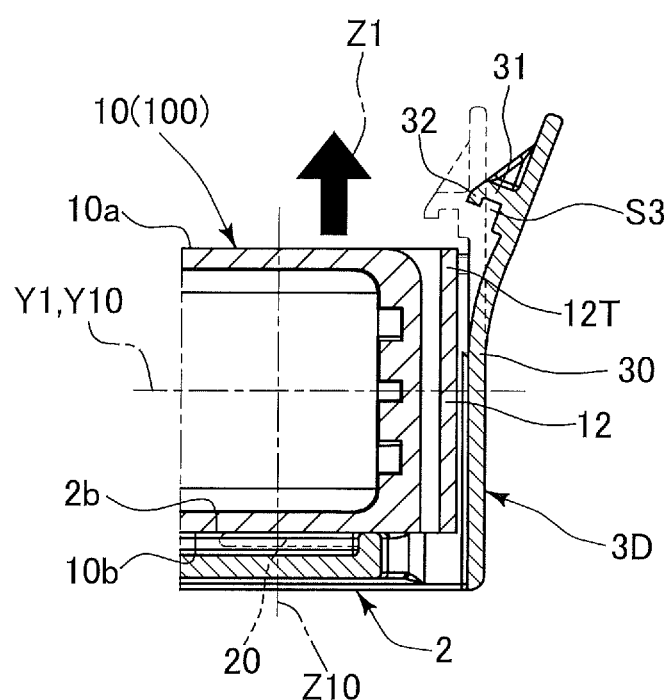
FIG. 11 shows a process subsequent to the process in FIG. 10.

Disassembling the case 10 from the electronic control component bracket 1 assembled with the case 10 will be described. FIG. 10 and FIG. 11 show disassembling at the side wall portion 3D side. However, the disassembling at the side wall portion 3C on the opposite side is performed in the same manner as at the side wall portion 3D side.

For disassembling the case 10 from the electronic control component bracket 1 assembled with the case 10, the case 10 is firstly pressed downward so as to be brought into contact with or close to the bottom wall portion 2, as shown in FIG. 10. Specifically, the case 10 is pressed downward so as to be disposed at a lower position than a position that is distant from the bottom wall portion 2 over the distance d (the protruding length of the downward protrusion 32: see FIG. 6). Thus, in each elastic extending portion 12 of the case 10, the upper end 12T is disengaged from the gap S3 and disposed downward of the end (lower end) of the downward protrusion 32, and each elastic wall portion 30 can be elastically deformed outward (direction indicated by an arrow Q2 in FIG. 10) at the end side (upper end side in FIG. 10) in the standing direction Z1.

Subsequently, as shown in FIG. 11, elastic deformation is caused such that the end side of each elastic wall portion 30 is pressed and widened outward (outward in the left-right direction Y10 of the case 10), and the disengagement-preventing portion 31 is caused to reach a position outward of the elastic extending portion 12. In this elastically deformed state, the case 10 is pulled upward in the standing direction Z1 (upward direction). Thus, the case 10 is pulled upward from between the side wall portions 3C and 3D opposing each other without interfering with the disengagement-preventing portions 31, and disassembled from the electronic control component bracket 1.

Although, in the case 10 shown in each of the cross-sectional views of FIG. 7 to FIG. 11, various circuit substrates are disposed as electronic control portions, the electronic control portions are not shown.

Although the embodiment of this invention has been described above, the embodiment is merely illustrative, and this invention is not limited thereto. Various modifications such as additions and omissions may be made based on the knowledge of a person skilled in the art without departing from the scope of the claims.

DESCRIPTION OF THE REFERENCE CHARACTERS 1 electronic control component bracket
2 bottom wall portion
3C, 3D side wall portion
30 elastic wall portion
31 disengagement-preventing portion
32 downward protrusion
S3 gap
V3 cut portion
10 case
10a upper surface
10b lower surface
10c, 10d, 10e assembling side surface
12 elastic extending portion
12T upper end of elastic extending portion
Z1 standing direction

What is claimed is:

1. An electronic control component bracket that is assembled with a resin case which has an electronic control portion thereinside, and which has a rectangular upper surface, a rectangular lower surface, and four side surfaces surrounding an outer peripheral side between the upper surface and the lower surface and including an assembling side surface formed so as to have an elastic extending portion protruding outward and then extending in an outer peripheral direction from a protrusion end, having a free end at an end, and having a width in an up-down direction, wherein the electronic control component bracket is formed as a resin injection-molded product in which a bottom wall portion disposed so as to oppose the lower surface of the case, and a side wall portion disposed so as to stand from the bottom wall portion and oppose the corresponding assembling side surface are integrated with each other, the side wall portion has an elastic wall portion which is disposed between two cut portions each having an opening at an end side in a standing direction and extending toward the bottom wall portion and which has a lower stiffness than the elastic extending portion, and a disengagement-preventing portion protruding inward from the end side of the elastic wall portion in the standing direction, the disengagement-preventing portion has a downward protrusion that protrudes from a protrusion end side of the disengagement-preventing portion toward the bottom wall portion, and that forms a gap between the elastic wall portion and the downward protrusion, and when the case is moved close to the bottom wall portion with the lower surface of the case being disposed at a head such that the assembling side surface opposes the corresponding side wall portion in order to assemble the case, the elastic extending portion is moved over the disengagement-preventing portion, to cause elastic deformation of the elastic wall portion, the elastic deformation is released after the elastic extending portion has been moved over the disengagement-preventing portion, an upper end of the elastic extending portion is moved into the bottom wall portion side of the disengagement-preventing portion so as to be stored in the gap according to the elastic deformation being released, and the case is assembled in a disengagement preventing state.

2. The electronic control component bracket according to claim 1, wherein
the case has a left side surface and a right side surface as the assembling side surface, and
the side wall portion is wall portions that stand from both sides, in a predetermined width direction, of the bottom wall portion, one of the side wall portions is a left side wall portion disposed so as to oppose the left side surface, and another side wall portion is a right side wall portion disposed so as to oppose the right side surface.

3. The electronic control component bracket according to claim 1, wherein
the bottom wall portion has a plurality of pressing-up elastic pieces that press upward the lower surface of the case in the assembled state, to maintain a lock-engaged state in which the upper end of the elastic extending portion is pressed against a lower surface of the disengagement-preventing portion, and in the assembled state, when the lower surface of the case is maintained so as to be pressed upward by the pressing-up elastic pieces, the lower surface of the case is positioned above a bottom surface of the bottom wall portion so as to be spaced upward from the bottom surface over a distance greater than a downward protruding length of the downward protrusion.

\* \* \* \* \*